United States Patent
Choi et al.

(10) Patent No.: US 10,475,751 B2
(45) Date of Patent: Nov. 12, 2019

(54) FAN-OUT SEMICONDUCTOR PACKAGE

(71) Applicant: SAMSUNG ELECTRO-MECHANICS CO., LTD., Suwon-Si, Gyeonggi-Do (KR)

(72) Inventors: Seong Hee Choi, Suwon-Si (KR); Han Kim, Suwon-Si (KR); Hyung Joon Kim, Suwon-Si (KR); Mi Ja Han, Suwon-Si (KR)

(73) Assignee: SAMSUNG ELECTRO-MECHANICS CO., LTD., Suwon-si, Gyeonggi-Do (KR)

( * ) Notice: Subject to any disclaimer, the term of this patent is extended or adjusted under 35 U.S.C. 154(b) by 0 days.

(21) Appl. No.: 16/120,150

(22) Filed: Aug. 31, 2018

(65) Prior Publication Data

US 2019/0237406 A1    Aug. 1, 2019

(30) Foreign Application Priority Data

Jan. 31, 2018   (KR) ........................ 10-2018-0012039

(51) Int. Cl.
*H01L 23/552* (2006.01)
*H01L 23/31* (2006.01)
(Continued)

(52) U.S. Cl.
CPC ........ *H01L 23/552* (2013.01); *H01L 21/4853* (2013.01); *H01L 21/4857* (2013.01); *H01L 21/565* (2013.01); *H01L 21/6835* (2013.01); *H01L 23/3107* (2013.01); *H01L 23/5383* (2013.01); *H01L 23/5386* (2013.01); *H01L 23/5389* (2013.01); *H01L 24/19* (2013.01);
(Continued)

(58) Field of Classification Search
CPC ............. H01L 21/4857; H01L 21/4853; H01L 21/6835; H01L 23/3107; H01L 23/552; H01L 23/5383; H01L 23/5386; H01L 24/19; H01L 24/20
USPC ......................................................... 257/659
See application file for complete search history.

(56) References Cited

U.S. PATENT DOCUMENTS 8,432,022 B1    4/2013  Huemoeller et al.
9,299,651 B2 *  3/2016  Lin ................... H01L 23/49816
(Continued)

FOREIGN PATENT DOCUMENTS

KR    10-2015-0014568 A    2/2015
KR    10-2016-0066311 A    6/2016
(Continued)

OTHER PUBLICATIONS

Office Action issued in corresponding Taiwanese Application No. 107130191, dated Jun. 28, 2019.

*Primary Examiner* — Luan C Thai
(74) *Attorney, Agent, or Firm* — Morgan, Lewis & Bockius LLP

(57) ABSTRACT

A fan-out semiconductor package includes: a core member having at least one through-hole formed therein and having a metal layer disposed on an internal surface thereof; an electronic component disposed in the through-hole; an encapsulant encapsulating the core member and the electronic component; a metal plate disposed on an upper surface of the encapsulant; and a wall penetrating the encapsulant to connect the metal layer and the metal plate to each other. The wall includes sections spaced apart from each other.

13 Claims, 20 Drawing Sheets

(51) Int. Cl.
*H01L 23/538* (2006.01)
*H01L 23/00* (2006.01)
*H01L 21/48* (2006.01)
*H01L 21/56* (2006.01)
*H01L 21/683* (2006.01)

(52) U.S. Cl.
CPC .... *H01L 24/20* (2013.01); *H01L 2221/68372* (2013.01); *H01L 2224/18* (2013.01); *H01L 2224/214* (2013.01); *H01L 2924/3025* (2013.01)

(56) References Cited

U.S. PATENT DOCUMENTS

| | | | |
|---|---|---|---|
| 9,318,411 B2* | 4/2016 | Lin | H01L 24/97 |
| 10,211,071 B2* | 2/2019 | Ho | H01L 21/561 |
| 2015/0028477 A1 | 1/2015 | Jung et al. | |
| 2015/0155256 A1 | 6/2015 | Lin et al. | |
| 2016/0111376 A1 | 4/2016 | Seo et al. | |
| 2016/0155713 A1 | 6/2016 | Kim et al. | |
| 2017/0098634 A1 | 4/2017 | Kumar et al. | |

FOREIGN PATENT DOCUMENTS

| | | |
|---|---|---|
| TW | 201523834 A | 6/2015 |
| TW | 201714276 A | 4/2017 |

\* cited by examiner

FAN-OUT SEMICONDUCTOR PACKAGE

CROSS-REFERENCE TO RELATED APPLICATION(S)

This application claims benefit of priority to Korean Patent Application No. 10-2018-0012039 filed on Jan. 31, 2018 in the Korean Intellectual Property Office, the disclosure of which is incorporated herein by reference in its entirety.

TECHNICAL FIELD

The present disclosure relates to a fan-out semiconductor package.

BACKGROUND

In accordance with an explosive increase in the use of various electronic devices and the development of digital technology, semiconductor technology, and the like, precise and complicated electronic devices have been used in a wide variety of fields. In accordance with an increase in a density of internal components of the electronic devices, electromagnetic interference (EMI) generated from individual components (such as active components and passive components) and a printed circuit board (PCB), physically connecting the individual components to each other, have caused a malfunction between the precise electronic devices as well as radio noise interference.

In order to shield EMI noise that may cause the electromagnetic interference, various methods have been used, and examples of these methods include a method of using a shield can, a film, an absorber sheet, or the like.

However, the method of using the shield can, the film, or the absorber sheet is a method of shielding noise by adding a separate component. Therefore, there is a need to develop a structure capable of shielding EMI noise in a module itself.

SUMMARY

An aspect of the present disclosure may provide a fan-out semiconductor package having improved electromagnetic interference (EMI) shielding efficiency and being easily manufactured.

According to an aspect of the present disclosure, a fan-out semiconductor package may include: a core member having at least one through-hole formed therein and having a metal layer disposed on an internal surface thereof; an electronic component disposed in the through-hole; an encapsulant encapsulating the core member and the electronic component; a metal plate disposed on an upper surface of the encapsulant; and a wall penetrating through the encapsulant to connect the metal layer and the metal plate to each other. The wall may include sections spaced apart from each other.

The wall may be made of a metal.

The wall may extend from a lower surface of the metal plate.

The wall may extend from the metal layer of the core member.

The wall may include a first wall extending from a lower surface of the metal plate and a second wall extending from the metal layer of the core member.

The first wall and the second wall may be bonded to each other.

The wall may have a zigzag shape.

The core member may include an insulator layer made of an insulating material and the metal layer disposed on an internal surface of the insulator layer and portions of an upper surface and a lower surface of the insulator layer.

The core member may include an outer wall portion disposed at an edge of the fan-out semiconductor package and an inner wall portion disposed inside the outer wall portion.

The wall disposed on the outer wall portion may have a width greater than that of the wall disposed on the inner wall portion.

The semiconductor chip may include a semiconductor chip disposed in the through-hole and a passive component spaced apart from the semiconductor chip.

According to another aspect of the present disclosure, a fan-out semiconductor package may include: a core member having at least one through-hole formed therein and having a metal layer disposed on an internal surface thereof; an electronic component disposed in the through-hole; an encapsulant encapsulating the core member and the electronic component; a metal plate disposed on an upper surface of the encapsulant; a first wall extending from the metal layer; and a second wall extending from a lower surface of the metal plate. The first wall and the second wall may be offset from each other.

At least one of the first and second walls includes sections spaced-apart from each other.

BRIEF DESCRIPTION OF DRAWINGS

The above and other aspects, features, and advantages of the present disclosure will be more clearly understood from the following detailed description taken in conjunction with the accompanying drawings, in which.

DETAILED DESCRIPTION

Hereinafter, exemplary embodiments of the present disclosure will now be described in detail with reference to the accompanying drawings.

Electronic Device

Figure 1:
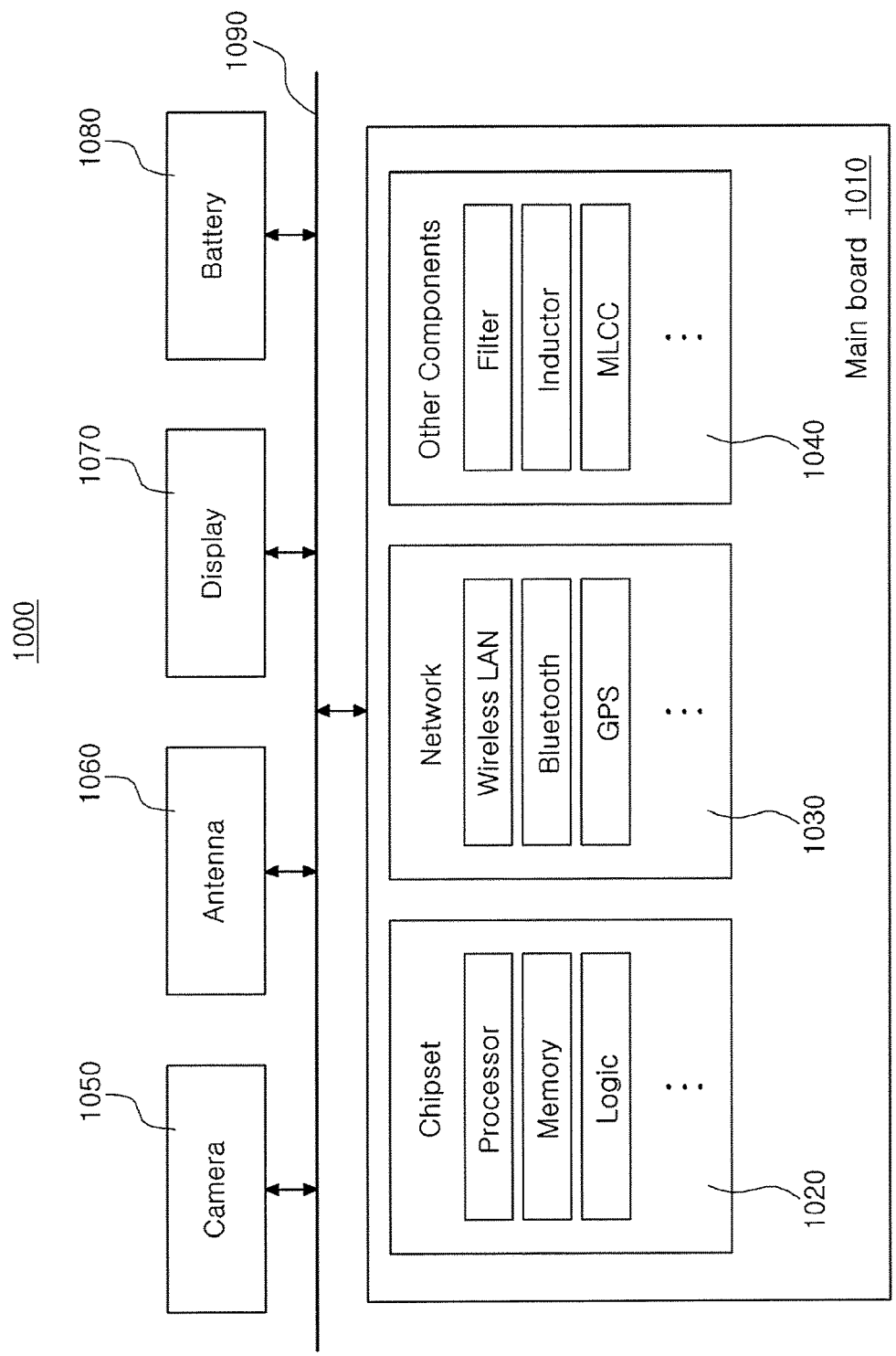
FIG. 1 is a schematic block diagram illustrating an example of an electronic device system.

FIG. 1 is a schematic block diagram illustrating an example of an electronic device system.

Referring to FIG. 1, an electronic device 1000 may accommodate a mainboard 1010 therein. The mainboard 1010 may include chip related components 1020, network related components 1030, other components 1040, and the like, physically or electrically connected thereto. These components may be connected to others to be described below to form various signal lines 1090.

The chip related components 1020 may include a memory chip such as a volatile memory (for example, a dynamic random access memory (DRAM)), a non-volatile memory (for example, a read only memory (ROM)), a flash memory, or the like; an application processor chip such as a central processor (for example, a central processing unit (CPU)), a graphics processor (for example, a graphics processing unit (GPU)), a digital signal processor, a cryptographic processor, a microprocessor, a microcontroller, or the like; and a logic chip such as an analog-to-digital (ADC) converter, an application-specific integrated circuit (ASIC), or the like. However, the chip related components 1020 are not limited thereto, but may also include other types of chip related components. In addition, the chip related components 1020 may be combined with each other.

The network related components 1030 may include protocols such as wireless fidelity (Wi-Fi) (Institute of Electrical And Electronics Engineers (IEEE) 802.11 family, or the like), worldwide interoperability for microwave access (Wi-MAX) (IEEE 802.16 family, or the like), IEEE 802.20, long term evolution (LTE), evolution data only (Ev-DO), high speed packet access+ (HSPA+), high speed downlink packet access+(HSDPA+), high speed uplink packet access+ (HSUPA+), enhanced data GSM environment (EDGE), global system for mobile communications (GSM), global positioning system (GPS), general packet radio service (GPRS), code division multiple access (CDMA), time division multiple access (TDMA), digital enhanced cordless telecommunications (DECT), Bluetooth, 3G, 4G, and 5G protocols, and any other wireless and wired protocols, designated after the abovementioned protocols. However, the network related components 1030 are not limited thereto, but may also include a variety of other wireless or wired standards or protocols. In addition, the network related components 1030 may be combined with each other, together with the chip related components 1020 described above.

Other components 1040 may include a high frequency inductor, a ferrite inductor, a power inductor, ferrite beads, a low temperature co-fired ceramic (LTCC), an electromagnetic interference (EMI) filter, a multilayer ceramic capacitor (MLCC), or the like. However, other components 1040 are not limited thereto, but may also include passive components used for various other purposes, or the like. In addition, other components 1040 may be combined with each other, together with the chip related components 1020 or the network related components 1030 described above.

Depending on a type of the electronic device 1000, the electronic device 1000 may include other components that may or may not be physically or electrically connected to the mainboard 1010. These other components may include, for example, a camera module 1050, an antenna 1060, a display device 1070, a battery 1080, an audio codec (not illustrated), a video codec (not illustrated), a power amplifier (not illustrated), a compass (not illustrated), an accelerometer (not illustrated), a gyroscope (not illustrated), a speaker (not illustrated), a mass storage unit (for example, a hard disk drive) (not illustrated), a compact disk (CD) drive (not illustrated), a digital versatile disk (DVD) drive (not illustrated), or the like. However, these other components are not limited thereto, but may also include other components used for various purposes depending on a type of electronic device 1000, or the like.

The electronic device 1000 may be a smartphone, a personal digital assistant (PDA), a digital video camera, a digital still camera, a network system, a computer, a monitor, a tablet PC, a laptop PC, a netbook PC, a television, a video game machine, a smartwatch, an automotive component, or the like. However, the electronic device 1000 is not limited thereto, but may be any other electronic device processing data.

Figure 2:
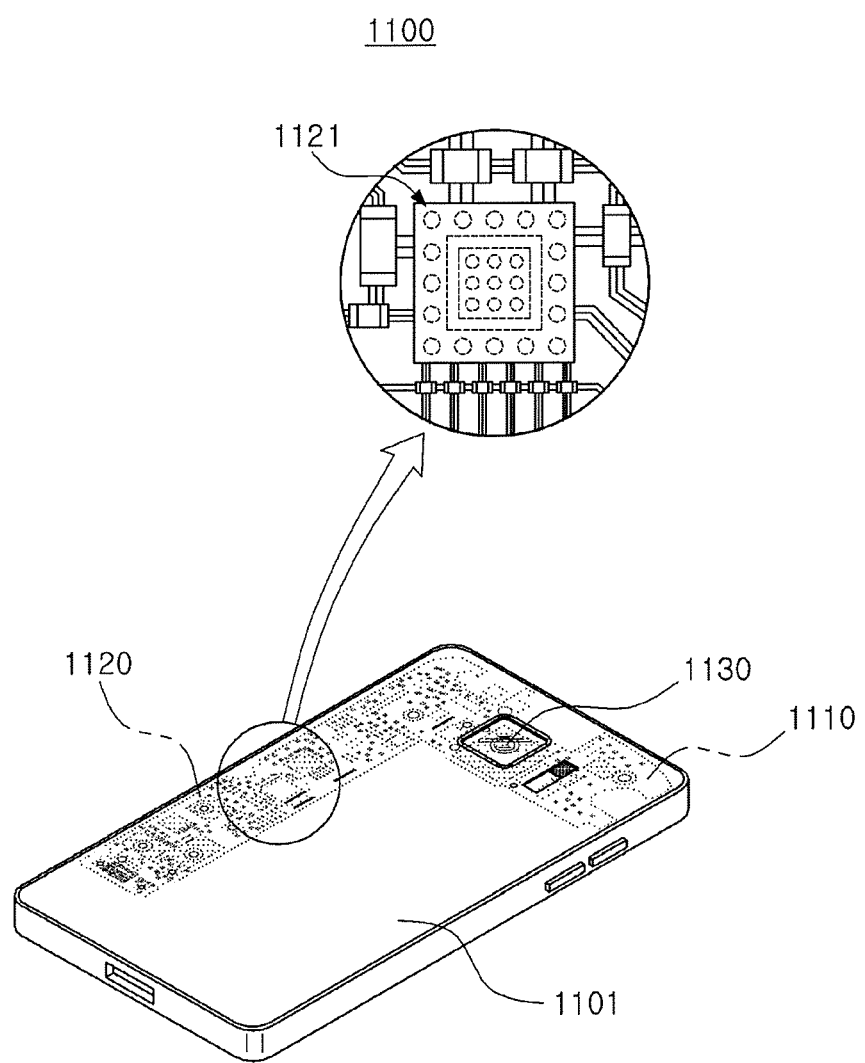
FIG. 2 is a schematic perspective view illustrating an example of an electronic device.

FIG. 2 is a schematic perspective view illustrating an example of an electronic device.

Referring to FIG. 2, a semiconductor package may be used for various purposes in the various electronic devices 1000 as described above. For example, a motherboard 1110 may be accommodated in a body 1101 of a smartphone 1100, and various electronic components 1120 may be physically or electrically connected to the motherboard 1110. In addition, other components that may or may not be physically or electrically connected to the mainboard 1010, such as a camera module 1130, may be accommodated in the body 1101. Some of the electronic components 1120 may be the chip related components, and the semiconductor package 100 may be, for example, an application processor among the chip related components, but is not limited thereto. The electronic device is not necessarily limited to the smartphone 1100, but may be other electronic devices as described above.

Semiconductor Package

Generally, numerous fine electrical circuits are integrated in a semiconductor chip. However, the semiconductor chip may not serve as a finished semiconductor product in itself, and may be damaged due to external physical or chemical impacts. Therefore, the semiconductor chip itself may not be used, but may be packaged and used in an electronic device, or the like, in a packaged state.

Here, semiconductor packaging is required due to the existence of a difference in a circuit width between the semiconductor chip and a mainboard of the electronic device in terms of electrical connections. In detail, a size of connection pads of the semiconductor chip and an interval between the connection pads of the semiconductor chip are very fine, but a size of component mounting pads of the mainboard used in the electronic device and an interval between the component mounting pads of the mainboard are significantly larger than those of the semiconductor chip. Therefore, it may be difficult to directly mount the semiconductor chip on the mainboard, and packaging technology for buffering a difference in a circuit width between the semiconductor chip and the mainboard is required.

A semiconductor package manufactured by the packaging technology may be classified as a fan-in semiconductor package or a fan-out semiconductor package depending on a structure and a purpose thereof.

The fan-in semiconductor package and the fan-out semiconductor package will hereinafter be described in more detail with reference to the drawings.

Fan-in Semiconductor Package

Figure 3B:
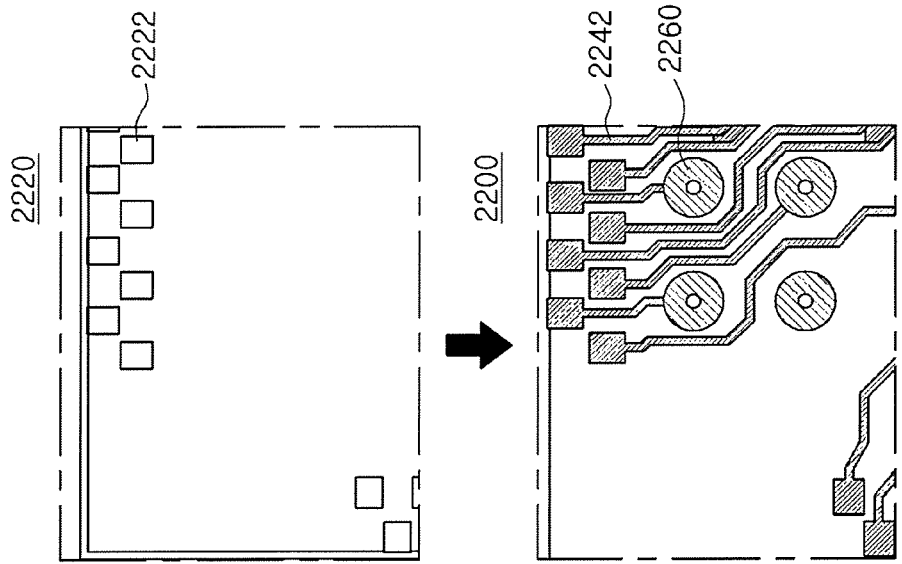
FIGS. 3A and 3B are schematic cross-sectional views illustrating states of a fan-in semiconductor package before and after being packaged.
Figure 3A:
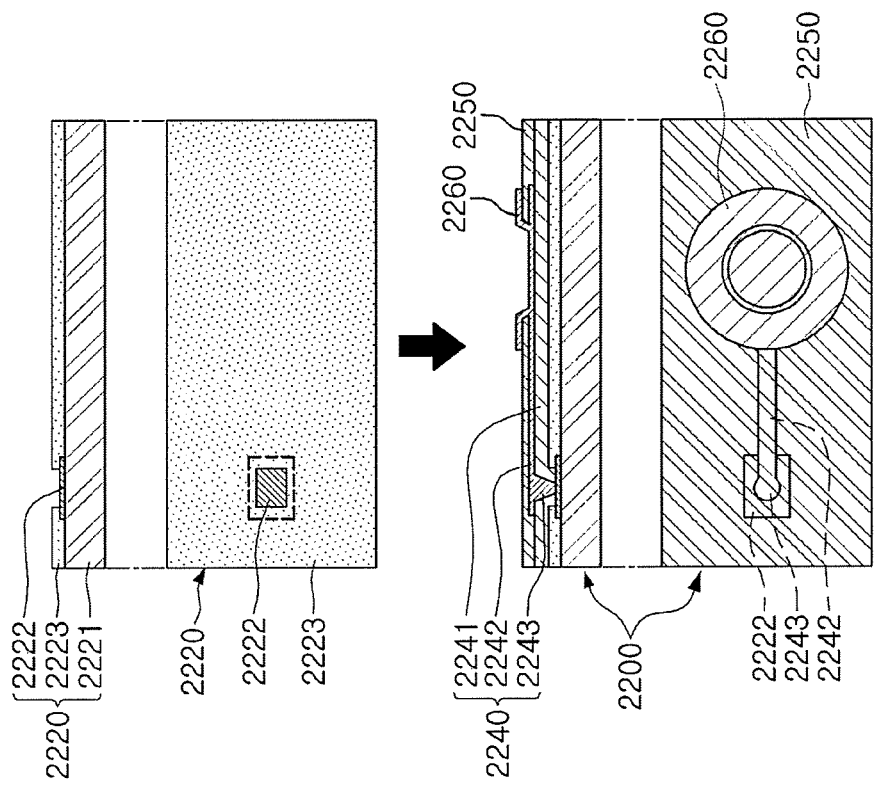

FIGS. 3A and 3B are schematic cross-sectional views illustrating states of a fan-in semiconductor package before and after being packaged.

Figure 4:
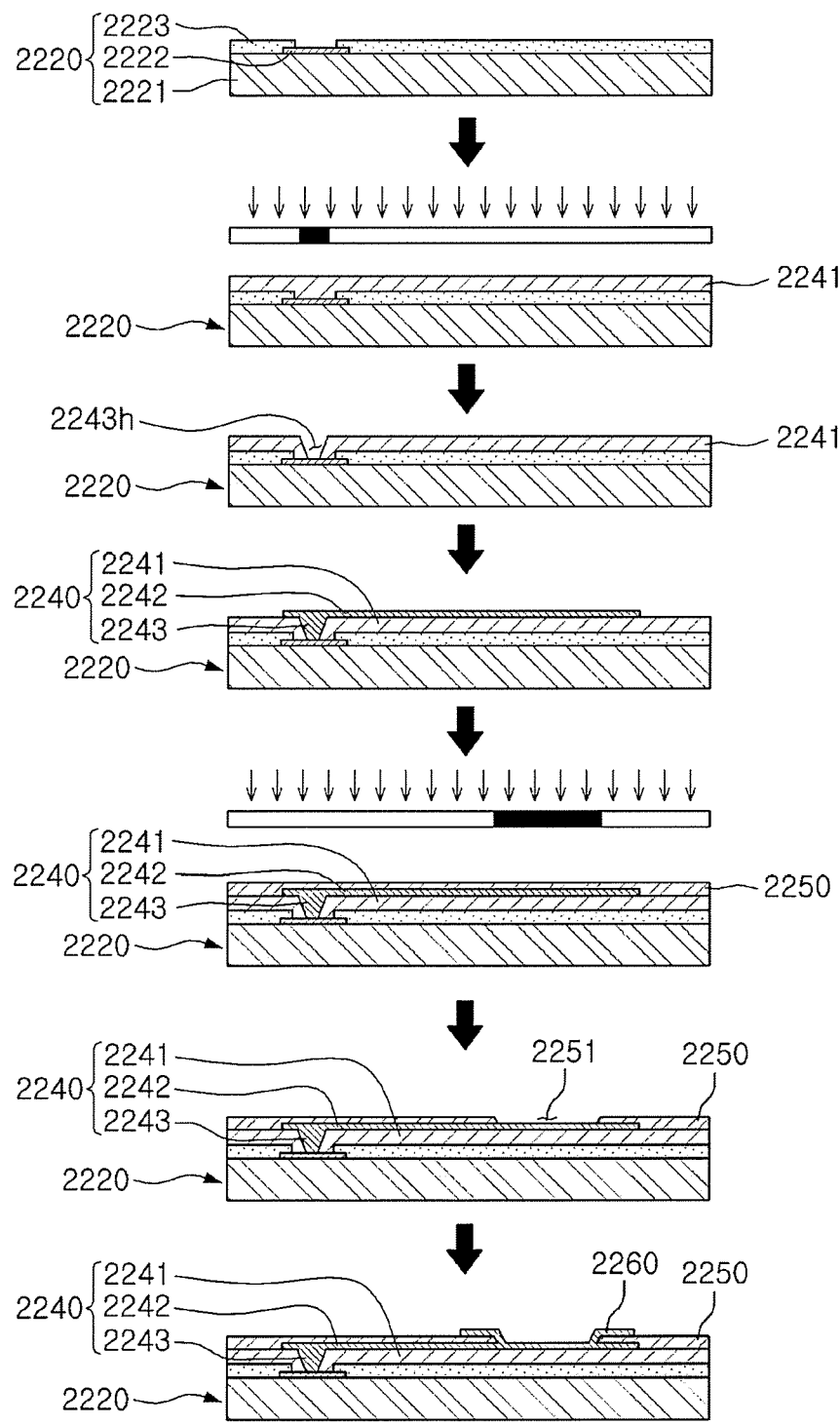
FIG. 4 is schematic cross-sectional views illustrating a packaging process of a fan-in semiconductor package.

FIG. 4 is schematic cross-sectional views illustrating a packaging process of a fan-in semiconductor package.

Referring to FIGS. 3 and 4, a semiconductor chip 2220 may be, for example, an integrated circuit (IC) in a bare state, including a body 2221 including silicon (Si), germanium (Ge), gallium arsenide (GaAs), or the like, connection pads 2222 formed on one surface of the body 2221 and including a conductive material such as aluminum (Al), or the like, and a passivation layer 2223 such as an oxide layer, a nitride layer, or the like, formed on one surface of the body 2221 and covering at least portions of the connection pads 2222. In this case, since the connection pads 2222 may be significantly small, it may be difficult to mount the integrated circuit (IC) on an intermediate level printed circuit board (PCB) as well as on the mainboard of the electronic device, or the like.

Therefore, a connection member 2240 may be formed depending on a size of the semiconductor chip 2220 on the semiconductor chip 2220 in order to redistribute the connection pads 2222. The connection member 2240 may be formed by forming an insulating layer 2241 on the semiconductor chip 2220 using an insulating material such as a photoimagable dielectric (PID) resin, forming via holes 2243h opening the connection pads 2222, and then forming wiring patterns 2242 and vias 2243. Then, a passivation layer 2250 protecting the connection member 2240 may be formed, an opening 2251 may be formed, and an underbump metal layer 2260, or the like, may be formed. That is, a fan-in semiconductor package 2200 including, for example, the semiconductor chip 2220, the connection member 2240, the passivation layer 2250, and the underbump metal layer 2260 may be manufactured through a series of processes.

As described above, the fan-in semiconductor package may have a package form in which all of the connection pads, for example, input/output (I/O) terminals, of the semiconductor chip are disposed inside the semiconductor chip, and may have excellent electrical characteristics and be produced at a low cost. Therefore, many elements mounted in smartphones have been manufactured in a fan-in semiconductor package form. In detail, many elements mounted in smartphones have been developed to implement a rapid signal transfer while having a compact size.

However, since all I/O terminals need to be disposed inside the semiconductor chip in the fan-in semiconductor package, the fan-in semiconductor package has significant spatial limitations. Therefore, it is difficult to apply this structure to a semiconductor chip having a large number of I/O terminals or a semiconductor chip having a compact size. In addition, due to the disadvantage described above, the fan-in semiconductor package may not be directly mounted and used on the mainboard of the electronic device. The reason is that even in a case in which a size of the I/O terminals of the semiconductor chip and an interval between the I/O terminals of the semiconductor chip are increased by a redistribution process, the size of the I/O terminals of the semiconductor chip and the interval between the I/O terminals of the semiconductor chip may not be sufficient to directly mount the fan-in electronic component package on the mainboard of the electronic device.

Figure 5:
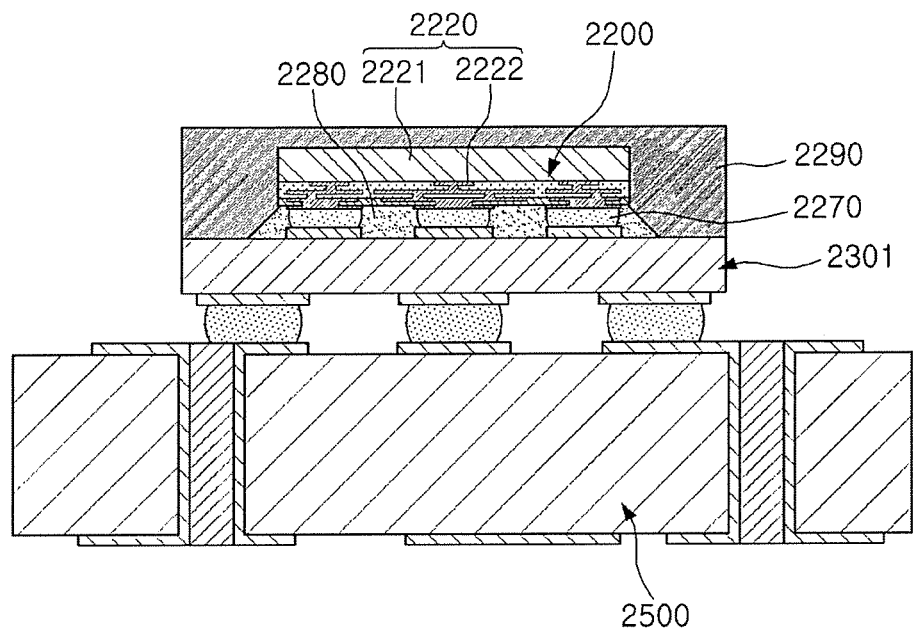
FIG. 5 is a schematic cross-sectional view illustrating a case in which a fan-in semiconductor package is mounted on an interposer substrate and is ultimately mounted on a mainboard of an electronic device.

FIG. 5 is a schematic cross-sectional view illustrating a case in which a fan-in semiconductor package is mounted on an interposer substrate and is ultimately mounted on a mainboard of an electronic device.

Figure 6:
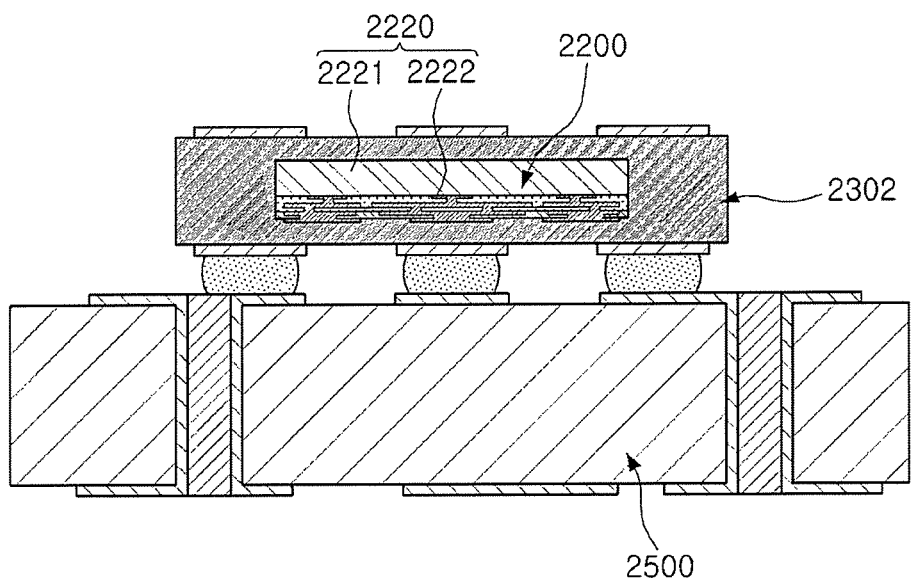
FIG. 6 is a schematic cross-sectional view illustrating a case in which a fan-in semiconductor package is embedded in an interposer substrate and is ultimately mounted on a mainboard of an electronic device.

FIG. 6 is a schematic cross-sectional view illustrating a case in which a fan-in semiconductor package is embedded in an interposer substrate and is ultimately mounted on a mainboard of an electronic device.

Referring to FIGS. 5 and 6, in a fan-in semiconductor package 2200, connection pads 2222, that is, I/O terminals, of a semiconductor chip 2220 may be redistributed through an interposer substrate 2301, and the fan-in semiconductor package 2200 may be ultimately mounted on a mainboard 2500 of an electronic device in a state in which it is mounted on the interposer substrate 2301. In this case, solder balls 2270, and the like, may be fixed by an underfill resin 2280, or the like, and an outer side of the semiconductor chip 2220 may be covered with an encapsulant 2290, or the like. Alternatively, a fan-in semiconductor package 2200 may be embedded in a separate interposer substrate 2302, connection pads 2222, that is, I/O terminals, of the semiconductor chip 2220 may be redistributed by the interposer substrate 2302 in a state in which the fan-in semiconductor package 2200 is embedded in the interposer substrate 2302, and the fan-in semiconductor package 2200 may be ultimately mounted on a mainboard 2500 of an electronic device.

As described above, it may be difficult to directly mount and use the fan-in semiconductor package on the mainboard of the electronic device. Therefore, the fan-in semiconductor package may be mounted on the separate interposer substrate and be then mounted on the mainboard of the electronic device through a packaging process or may be mounted and used on the mainboard of the electronic device in a state in which it is embedded in the interposer substrate.

Fan-Out Semiconductor Package

Figure 7:
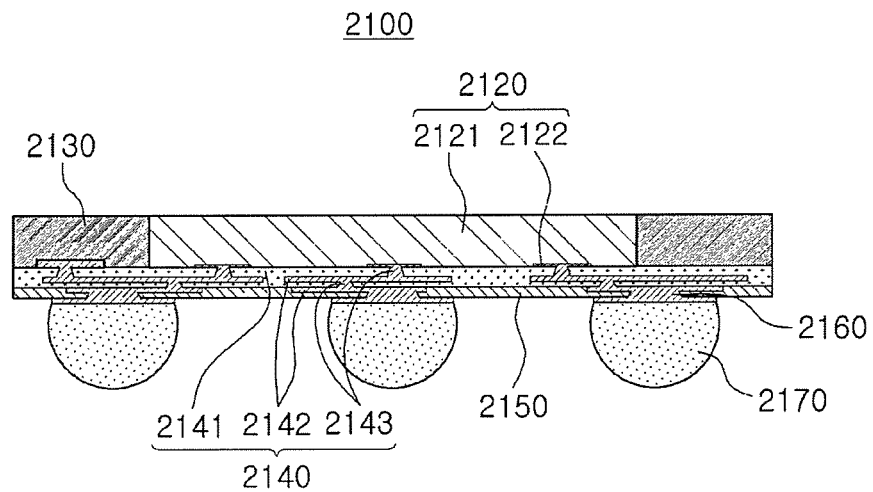
FIG. 7 is a schematic cross-sectional view illustrating a fan-out semiconductor package.

FIG. 7 is a schematic cross-sectional view illustrating a fan-out semiconductor package.

Referring to FIG. 7, in a fan-out semiconductor package 2100, for example, an outer side of a semiconductor chip 2120 may be protected by an encapsulant 2130, and connection pads 2122 of the semiconductor chip 2120 may be redistributed outwardly of the semiconductor chip 2120 by a connection member 2140. In this case, a passivation layer 2150 may further be formed on the connection member 2140, and an underbump metal layer 2160 may further be formed in openings of the passivation layer 2150. Solder balls 2170 may further be formed on the underbump metal layer 2160. The semiconductor chip 2120 may be an integrated circuit (IC) including a body 2121, the connection pads 2122, a passivation layer (not illustrated), and the like. The connection member 2140 may include an insulating layer 2141, redistribution layers 2142 formed on the insulating layer 2141, and vias 2143 electrically connecting the connection pads 2122 and the redistribution layers 2142 to each other.

As described above, the fan-out semiconductor package may have a form in which I/O terminals of the semiconductor chip are redistributed and disposed outwardly of the semiconductor chip through the connection member formed on the semiconductor chip. As described above, in the fan-in semiconductor package, all I/O terminals of the semiconductor chip need to be disposed inside the semiconductor chip. Therefore, when a size of the semiconductor chip is decreased, a size and a pitch of balls need to be decreased, such that a standardized ball layout may not be used in the fan-in semiconductor package. On the other hand, the fan-out semiconductor package has the form in which the I/O terminals of the semiconductor chip are redistributed and disposed outwardly of the semiconductor chip through the connection member formed on the semiconductor chip as described above. Therefore, even in a case that a size of the semiconductor chip is decreased, a standardized ball layout may be used in the fan-out semiconductor package as it is, such that the fan-out semiconductor package may be mounted on the mainboard of the electronic device without using a separate interposer substrate, as described below.

Figure 8:
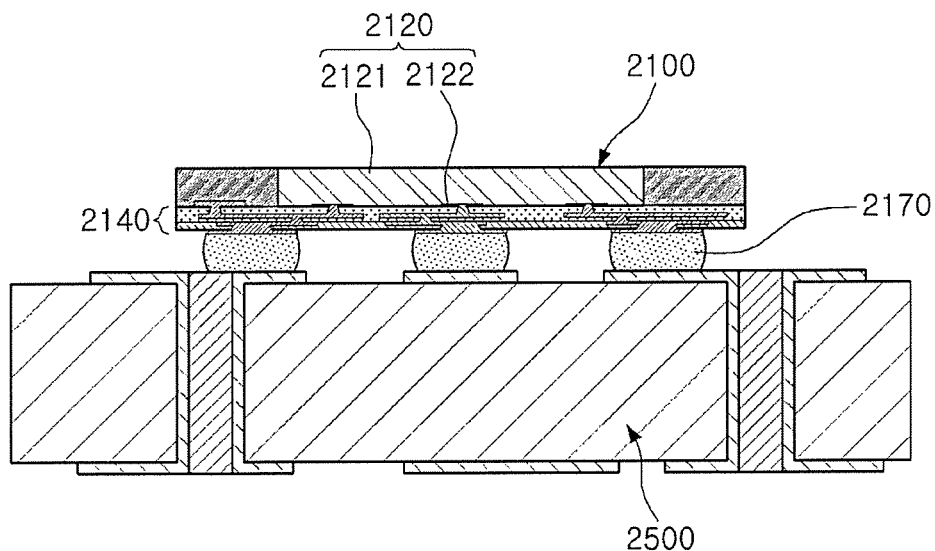
FIG. 8 is a schematic cross-sectional view illustrating a case in which a fan-out semiconductor package is mounted on a mainboard of an electronic device.

FIG. 8 is a schematic cross-sectional view illustrating a case in which a fan-out semiconductor package is mounted on a mainboard of an electronic device.

Referring to FIG. 8, a fan-out semiconductor package 2100 may be mounted on a mainboard 2500 of an electronic device through solder balls 2170, or the like. That is, as described above, the fan-out semiconductor package 2100 includes the connection member 2140 formed on the semiconductor chip 2120 and capable of redistributing the connection pads 2122 to a fan-out region that is outside of a size of the semiconductor chip 2120, such that the standardized ball layout may be used in the fan-out semiconductor package 2100 as it is. As a result, the fan-out semiconductor package 2100 may be mounted on the mainboard 2500 of the electronic device without using a separate interposer substrate, or the like.

As described above, since the fan-out semiconductor package may be mounted on the mainboard of the electronic device without using the separate interposer substrate, the fan-out semiconductor package may be implemented at a thickness lower than that of the fan-in semiconductor package using the interposer substrate. Therefore, the fan-out semiconductor package may be miniaturized and thinned. In addition, the fan-out electronic component package has excellent thermal characteristics and electrical characteristics, such that it is particularly appropriate for a mobile product. Therefore, the fan-out electronic component package may be implemented in a form more compact than that of a general package-on-package (POP) type using a printed circuit board (PCB), and may solve a problem due to the occurrence of a warpage phenomenon.

Meanwhile, the fan-out semiconductor package refers to package technology for mounting the semiconductor chip on the mainboard of the electronic device, or the like, as described above, and protecting the semiconductor chip from external impacts, and is a concept different from that of a printed circuit board (PCB) such as an interposer substrate, or the like, having a scale, a purpose, and the like, different from those of the fan-out semiconductor package, and having the fan-in semiconductor package embedded therein.

Fan-out semiconductor packages according to exemplary embodiments in the present disclosure will hereinafter be described with reference to the drawings.

Figure 9:
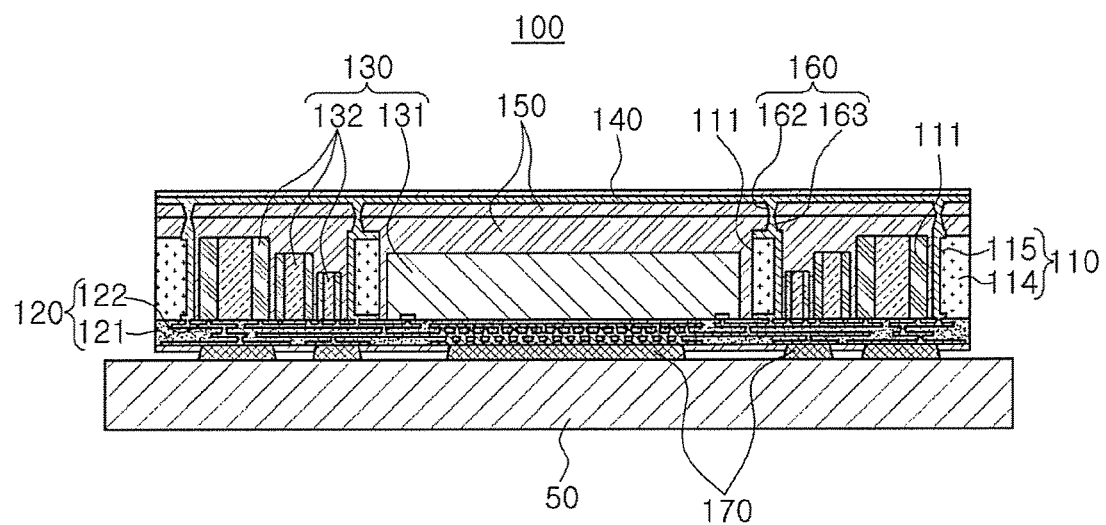
FIG. 9 is a cross-sectional view illustrating a fan-out semiconductor package according to a first exemplary embodiment in the present disclosure.
Figure 10:
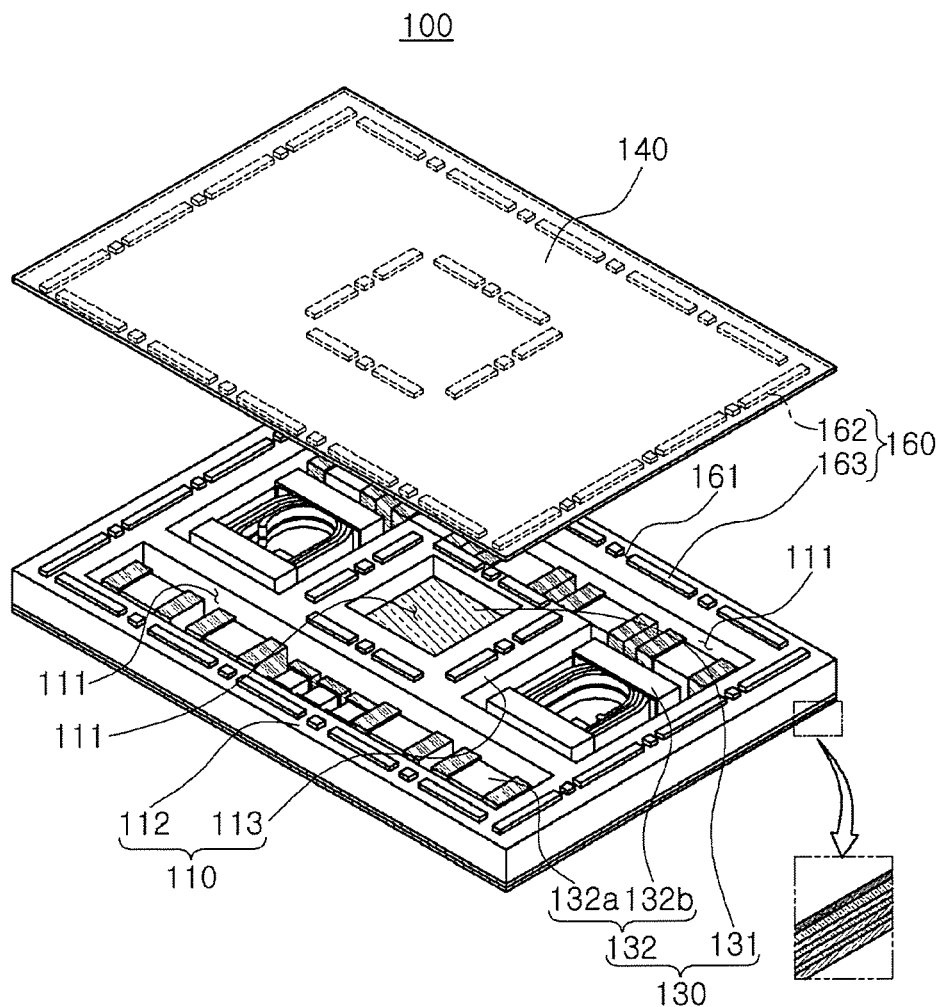
FIG. 10 is an exploded perspective view illustrating the fan-out semiconductor package according to a first exemplary embodiment in the present disclosure.

FIG. 9 is a cross-sectional view illustrating a fan-out semiconductor package according to a first exemplary embodiment in the present disclosure, and FIG. 10 is an exploded perspective view illustrating the fan-out semiconductor package according to a first exemplary embodiment in the present disclosure.

Referring to FIGS. 9 and 10, a fan-out semiconductor package 100 according to a first exemplary embodiment in the present disclosure may include a core member 110, a redistribution portion 120, an electronic component 130, a metal plate 140, an encapsulant 150, and a wall 160 as an example.

At least one through-hole 111 may be formed in the core member 110. As an example, the core member 110 may be provided to support the fan-out semiconductor package 100, and may maintain rigidity and secure uniformity of a thickness.

In the present exemplary embodiment, the electronic component 130 may be disposed in the through-hole 111 of the core member 110. In addition, side surfaces of the electronic component 130 may be surrounded by the core member 110. However, such a form is only an example and may be variously modified to have other forms, and the core member 110 may perform another function depending on such a form.

Meanwhile, the electronic component 130 may be inserted into the through-hole 111. As an example, according to locations of various portions of the core member 110, the core member 110 may be divided into an outer wall portion 112 and an inner wall portion 113 depending on a position, as illustrated in FIG. 10. That is, the outer wall portion 112 may have a rectangular band shape and be disposed at an edge of the core member 110, and the inner wall portion 113 may be disposed in an inner region of the outer wall portion 112. In addition, an internal space formed by the outer wall portion 112 may be divided into a plurality of zones by the inner wall portion 113, and a plurality of through-holes 111 may thus be formed.

Materials for making the core member 110 may include an insulator layer 140 and a metal layer 150. The insulator layer 114 of the core member 110 may be formed of an insulating material. The insulating material may be a thermosetting resin such as an epoxy resin, a thermoplastic resin such as a polyimide resin, a resin having a reinforcement material such as a glass fiber or an inorganic filler impregnated in the thermosetting resin and the thermoplastic resin, for example, prepreg, Ajinomoto Build-up Film (ABF), FR-4, Bismaleimide Triazine (BT), or the like, but is not limited thereto. A metal having excellent rigidity or thermal conductivity may be disposed in the insulator layer 114. In this case, the metal may be an Fe—Ni-based alloy, and a Cu plating layer may be formed on a surface of the Fe—Ni-based alloy. In addition to the materials as described above, glass, ceramic, plastic, or the like, may also be disposed in the insulator layer 114. In addition, the insulator layer 114 may serve as a support member.

In addition, a metal layer 115 of the core member 110 may be formed on at least an internal surface of the insulator layer 114, and may include at least one selected from the group consisting of silver (Ag), palladium (Pd), aluminum (Al), nickel (Ni), titanium (Ti), gold (Au), copper (Cu), and platinum (Pt) having excellent conductivity, or mixtures thereof. The metal layer 115 may be formed by any known method such as electrolytic copper plating, electroless copper plating, or the like. In more detail, the metal layer 115 may be formed using a method such as chemical vapor deposition (CVD), physical vapor deposition (PVD), sputtering, a subtractive process, an additive process, a semi-additive process (SAP), a modified semi-additive process (MSAP), or the like, but is not limited thereto.

The redistribution portion 120 may be disposed on one surface of the core member 110. As an example, the redistribution portion 120 may be stacked on a lower surface of the core member 110 and a lower surface of the electronic component 130. In addition, the redistribution portion 120 may include insulating layers 121 and a plurality of wiring layers 122. Some of the plurality of wiring layers 122 may be connected to each other. Further, portions of the wiring layer 122 may be disposed to be externally exposed from the insulating layer 121.

In addition, a material of each of the insulating layers 121 may be an insulating material. In this case, a photosensitive insulating material such as a PID resin may also be used as the insulating material. That is, each of the insulating layers 121 may be a photosensitive insulating layer. When the insulating layer 121 has photosensitive properties, the insulating layer 121 may be formed to have a smaller thickness, and a fine pitch of a via (not illustrated) may be achieved more easily. Each of the insulating layers 121 may be a photosensitive insulating layer including an insulating resin and an inorganic filler. When the insulating layers 121 are multiple layers, materials of the insulating layers 121 may be the same as each other, and may also be different from each other, if necessary. When the insulating layers 121 are the multiple layers, the insulating layers 121 may be integrated with each other depending on a process, such that a boundary therebetween may also not be apparent.

The wiring layers 122 may serve to substantially redistribute connection pads (not illustrated) of the electronic component 130, and a material of each of the wiring layers 122 may be a conductive material such as copper (Cu), aluminum (Al), silver (Ag), tin (Sn), gold (Au), nickel (Ni), lead (Pb), titanium (Ti), or alloys thereof. The wiring layers 122 may perform various functions depending on designs of corresponding layers. For example, the wiring layers 122 may include ground patterns, power patterns, signal patterns, and the like. Here, the signal patterns may include various signals except for the ground patterns, the power patterns, and the like, such as data signals, and the like. In addition, the wiring layers 122 may include various pad patterns, and the like.

The electronic component 130 may be inserted into the through-hole 111. As an example, the electronic component 130 may include a semiconductor chip 131 disposed in a through-hole 111 disposed in a central portion of the core member 110 and passive component 132 disposed in other through-holes 111 to be disposed in the vicinity of the semiconductor chip 131.

The semiconductor chip 131 may be an integrated circuit (IC) provided in an amount of several hundred to several million elements integrated in a single chip, an active element, or the like. The semiconductor chip 131 may also be a semiconductor chip in which an integrated circuit is packaged in a flip-chip form, if necessary. The IC may be, for example, an application processor chip such as a central processor (for example, a CPU), a graphic processor (for example, a GPU), a digital signal processor, a cryptographic processor, a micro processor, a micro controller, or the like, but is not limited thereto.

Meanwhile, connection pads (not illustrated) for electrical connection may be formed on the semiconductor chip 131, and may be connected to the redistribution portion 120.

The passive component 132 may be disposed side by side with the semiconductor chip 131 in a horizontal direction. As an example, the passive component 132 may include passive elements 132a and passive component 132b. As an example, the passive element 132a may be any one of a resistor, a capacitor, a trance, and a relay, and may serve to consume energy, accumulate energy therein, or pass energy therethrough, and the passive component 132b may be an inductor.

In addition, as an example, when the passive element 132a includes a decoupling capacitor provided in order to stably supply power to the semiconductor chip 131, and the like, the passive element 132a may be connected to the semiconductor chip 131 to serve as a decoupling capacitor.

The metal plate 140 may be disposed on an upper surface of the encapsulant 150. As an example, the metal plate 140 may be formed of a material having excellent conductivity. For example, the metal plate 140 may include at least one selected from the group consisting of silver (Ag), palladium (Pd), aluminum (Al), nickel (Ni), titanium (Ti), gold (Au), copper (Cu), and platinum (Pt), or mixtures thereof.

As described above, the metal plate 140 may be disposed on the upper surface of the encapsulant 150, and electromagnetic interference (EMI) noise shielding performance may thus be improved.

The encapsulant 150 may encapsulate the core member 110 and the electronic component 130. In addition, a material of the encapsulant 150 is not particularly limited. For example, an insulating material may be used as the material of the encapsulant 150. In this case, the insulating material may be a thermosetting resin such as an epoxy resin, a thermoplastic resin such as a polyimide resin, a resin in which the thermosetting resin or the thermoplastic resin is mixed with an inorganic filler or is impregnated together with an inorganic filler in a core material such as a glass fiber (or a glass cloth or a glass fabric), for example, prepreg, ABF, FR-4, BT, or the like. Alternatively, a PID resin may also be used as the insulating material.

The wall 160 may penetrate through the encapsulant 150 to connect the metal layer 115 and the metal plate 140 to each other. As an example, openings 161 providing a flow path of air may be formed in the wall 160 at the time of manufacturing the wall 160. As described above, the openings 161 may be formed in the wall 160 to provide the flow path of the air at the time of manufacturing the wall. Therefore, an increase in internal pressure by the wall 160 may be prevented.

As an example, the wall 160 may include a first wall 162 extending from a lower surface of the metal plate 140 and a second wall 163 extending from an upper surface of the core member 110.

In addition, the first wall 162 and the second wall 163 may be bonded to each other.

As described above, the wall 160 may be disposed in a space between the semiconductor chip 131 and the passive component 132 of the electronic component 130 and act as an EMI shielding element to shield interference between the semiconductor chip 131 and the passive component 132. As such, the interference due to EMI noise generated from the semiconductor chip 131 and the passive component 132 may thus be decreased.

Electrical connection structures 170 may physically or electrically externally connect the fan-out semiconductor package 100. For example, the fan-out semiconductor package 100 may be mounted on a mainboard 50 of an electronic device through the electrical connection structures 170. Each of the electrical connection structures 170 may be formed of a conductive material, for example, a solder, or the like. However, this is only an example, and a material of each of the electrical connection structures 170 is not particularly limited thereto. Each of the electrical connection structures 170 may be a land, a ball, a pin, or the like. The electrical connection structures 170 may be formed as a multilayer or single layer structure. When the electrical connection structures 170 are formed as a multilayer structure, the electrical connection structures 170 may include a copper (Cu) pillar and a solder. When the electrical connection structures 170 are formed as a single layer structure, the electrical connection structures 170 may include a tin-silver solder or copper (Cu). However, this is only an example, and the electrical connection structures 170 are not limited thereto.

The number, an interval, a disposition form, and the like, of electrical connection structures 170 are not particularly limited, but may be sufficiently modified depending on design particulars by those skilled in the art. For example, the electrical connection structures 170 may be provided in an amount of several tens to several thousands according to the number of connection pads of the semiconductor chip 120, or may be provided in an amount of several tens to several thousands or more or several tens to several thousands or less. When the electrical connection structures 170 are solder balls, the electrical connection structures 170 may cover side surfaces of the wiring layer 122 extending onto one surface of a passivation layer (not illustrated), and connection reliability may be more excellent.

At least one of the electrical connection structures 170 may be disposed in a fan-out region. The fan-out region refers to a region except for a region in which the semiconductor chip 131 is disposed. The fan-out package may have excellent reliability as compared to a fan-in package, may implement a plurality of input/output (I/O) terminals, and may facilitate a 3D interconnection. In addition, as compared to a ball grid array (BGA) package, a land grid array (LGA) package, or the like, the fan-out package may be manufactured to have a small thickness, and may have price competitiveness.

As described above, leakage of the EMI noise may be decreased through the wall 160 and the metal plate 140.

In addition, since the fan-out semiconductor package 100 according to the first exemplary embodiment includes the wall 160 and the metal plate 140, a shield can may be omitted, and the fan-out semiconductor package 100 according to the first exemplary embodiment may thus be implemented to have a compact size and a small thickness.

A method of manufacturing a fan-out semiconductor package according to a first exemplary embodiment in the present disclosure will hereinafter be described with reference to the drawings.

FIGS. 11 through 26 are views illustrating processes of a method of manufacturing a fan-out semiconductor package according to a first exemplary embodiment in the present disclosure.

Figure 11:
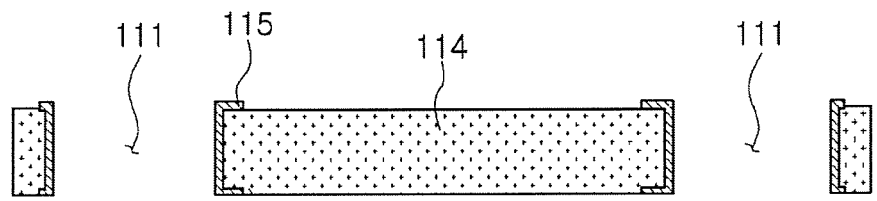
FIGS. 11 through 26 are views illustrating processes of a method of manufacturing a fan-out semiconductor package according to a first exemplary embodiment in the present disclosure.

First, referring to FIG. 11, the plurality of through-hole 111 may be formed in the insulator layer 114 of the core member 110. Then, the metal layer 115 may be formed on an internal surface of the insulator layer 114 and portions of an upper surface and a lower surface of the insulator layer 114.

Figure 12:
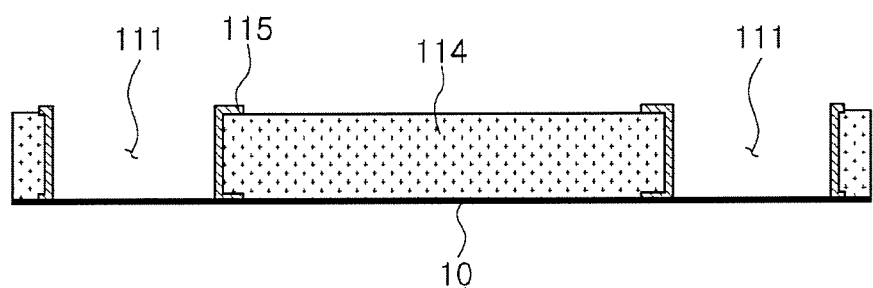

Then, as illustrated in FIG. 12, an adhesive tape 10 may be attached to the lower surface of the core member 110.

Figure 13:
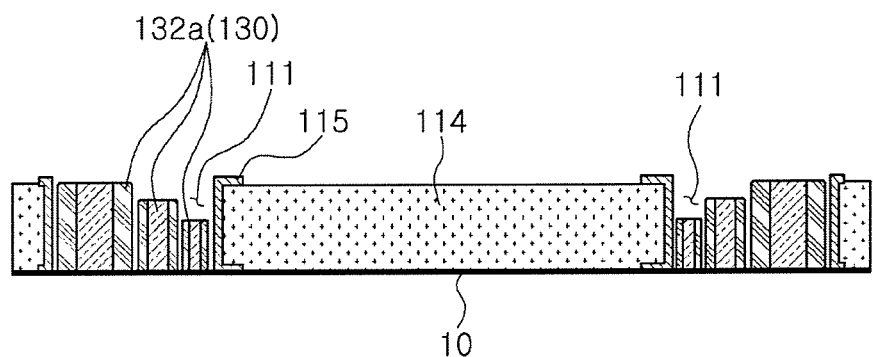

After the adhesive tape 10 is attached to the lower surface of the core member 110, the passive elements 132a and an inductor (not illustrated) may be attached to the adhesive tape 10 to be disposed in the through-holes 111, as illustrated in FIG. 13.

Figure 14:
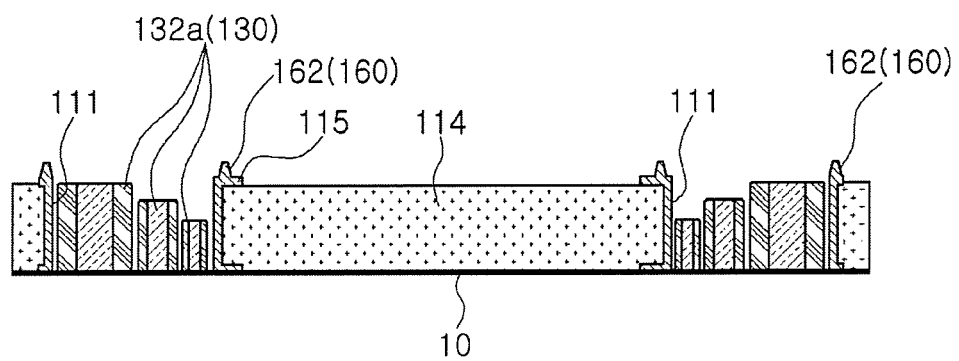

Then, as illustrated in FIG. 14, the wall 160 may be formed to extend from the metal layer 115 of the core member 110. The second wall 163 of the wall 160 may be formed by patterning.

Figure 15:
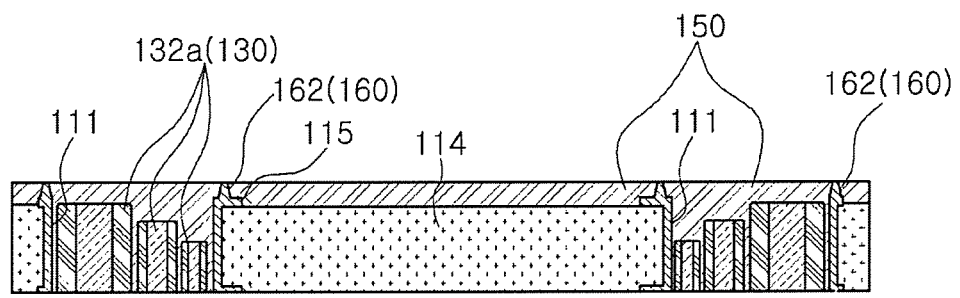

Then, as illustrated in FIG. 15, the encapsulant 150 encapsulating the passive elements 132a, the passive component 132b, and the core member 110 may be formed. In addition, the adhesive tape 10 may be removed after the encapsulant 150 is formed.

Figure 16:
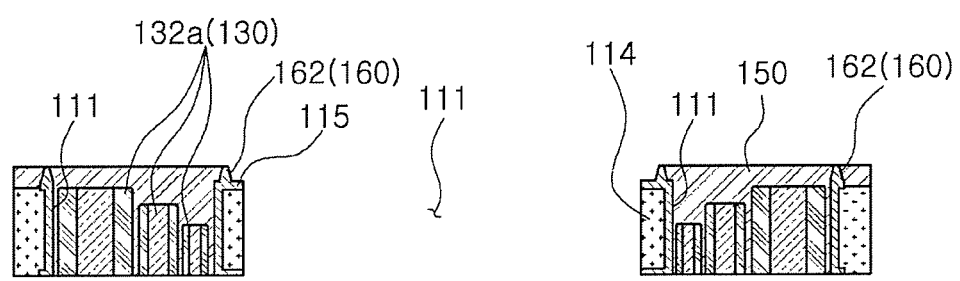

Then, as illustrated in FIG. 16, another through-hole 111 may be formed in a central portion of the core member 110.

Figure 17:
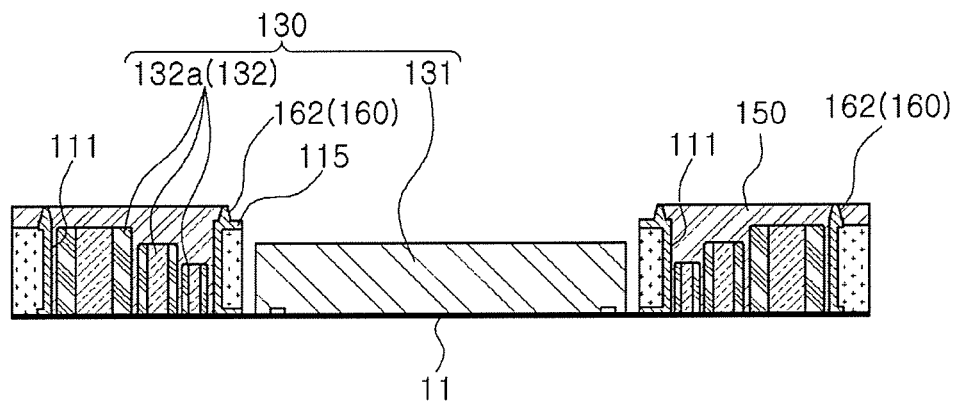

After the through-hole 110 is formed, another adhesive tape 11 may be attached to the lower surface of the core member 110, as illustrated in FIG. 17. Then, the semiconductor chip 131 of the electronic component 130 may be installed on the adhesive tape 11 to be disposed in the through-hole 111.

Figure 18:
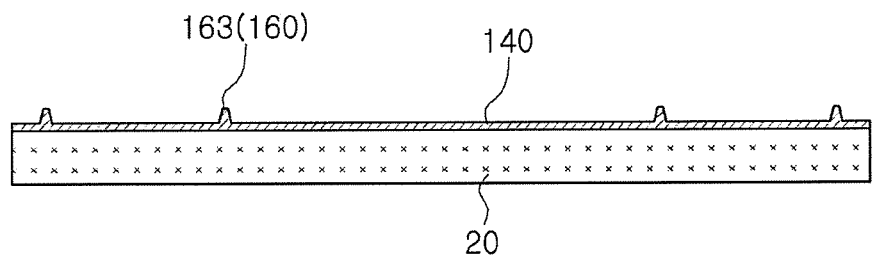

Then, as illustrated in FIG. 18, the metal plate 140 may be attached to an upper surface of the carrier 20, and the first wall 162 of the wall 160 may be formed. The wall 160 may be formed by patterning.

Figure 19:
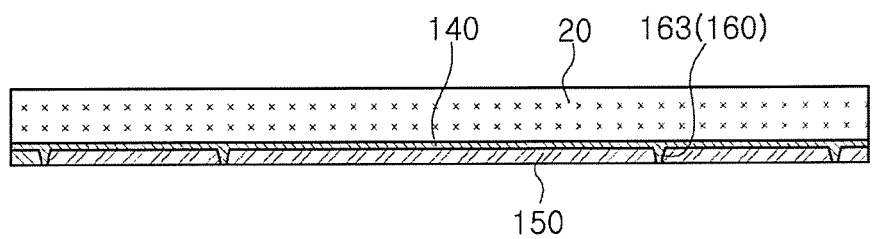

Then, as illustrated in FIG. 19, the encapsulant 150 encapsulating the first wall 162 may be formed on the metal plate 140.

Figure 20:
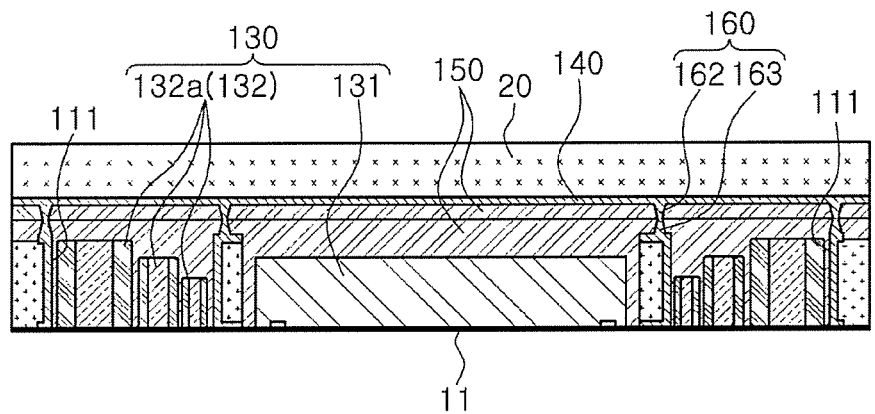

Then, as illustrated in FIG. 20, the metal plate 140 may be installed so that the first and second walls 162 and 163 are bonded to each other. Here, the wall 160 may include the first wall 162 formed beneath the metal plate 140 and the second wall 163 formed in the core member 110.

That is, as illustrated in FIG. 20, the metal plate 140 may be mounted on the core member 110 so that the first and second walls 162 and 163 are bonded to each other.

Figure 21:
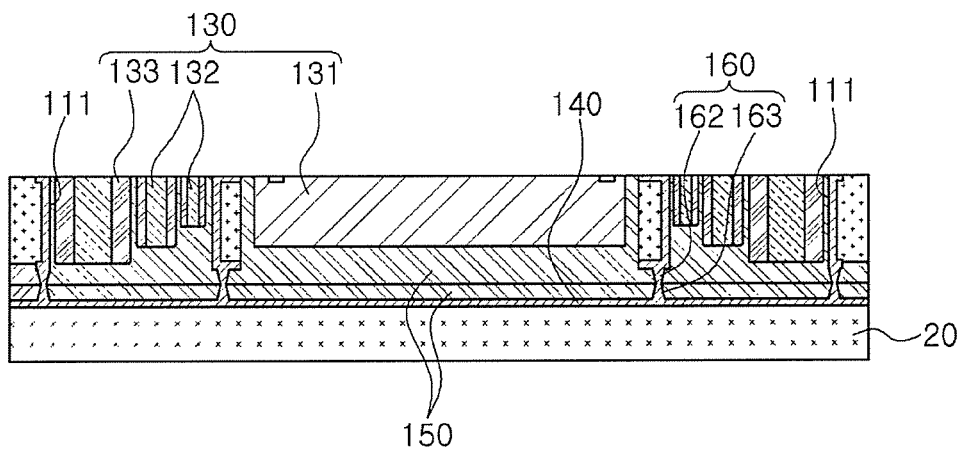

Then, as illustrated in FIG. 21, the adhesive tape 11 may be removed, and a planarization process may be performed by wet cleaning.

Figure 22:
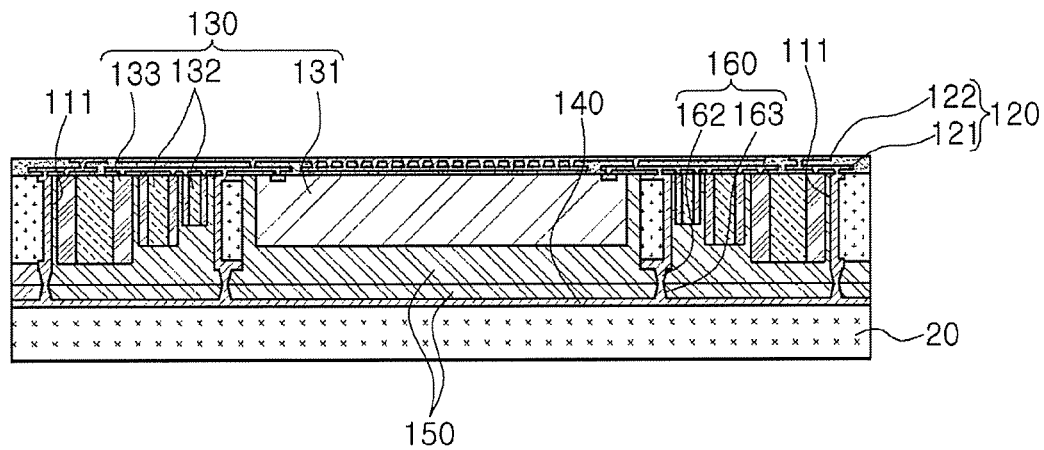
Figure 23:
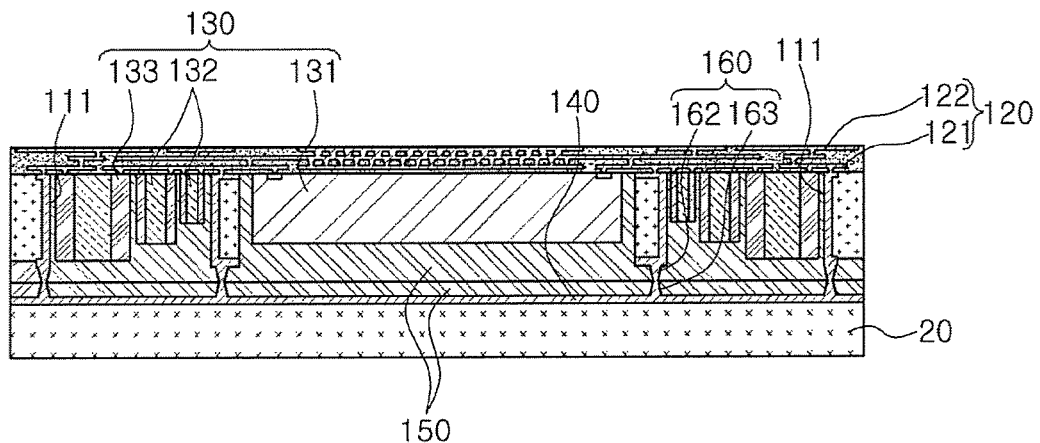

Then, as illustrated in FIGS. 22 and 23, the redistribution portion 120 may be formed. That is, the insulating layers 121 and the wiring layers 122 may be formed, and vias, or the like, for connecting the wiring layers 122 to each other may be formed.

Figure 24:
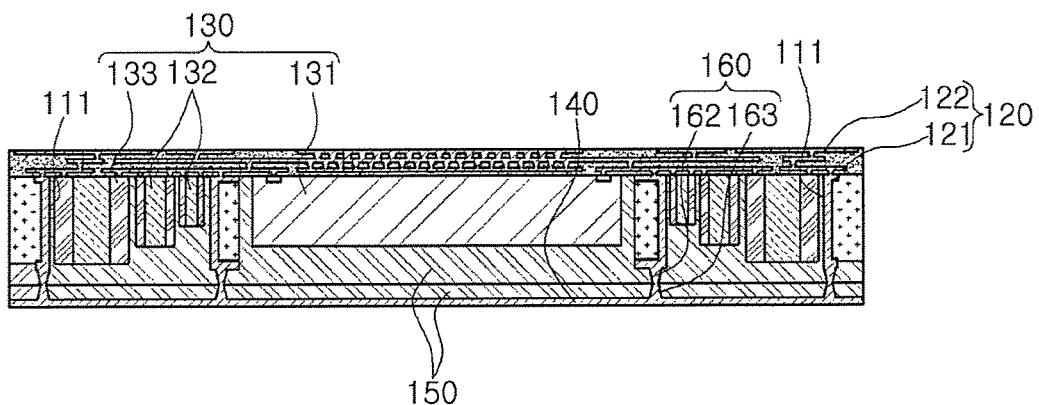

Then, as illustrated in FIG. 24, the carrier 20 may be removed.

Figure 25:
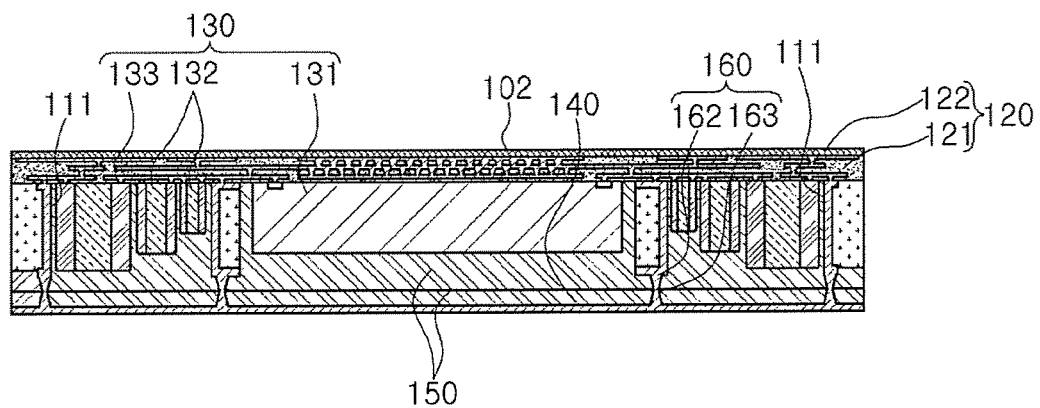

Then, as illustrated in FIG. 25, a passivation layer 102 may be formed in the metal plate 140 and the redistribution portion 120.

Figure 26:
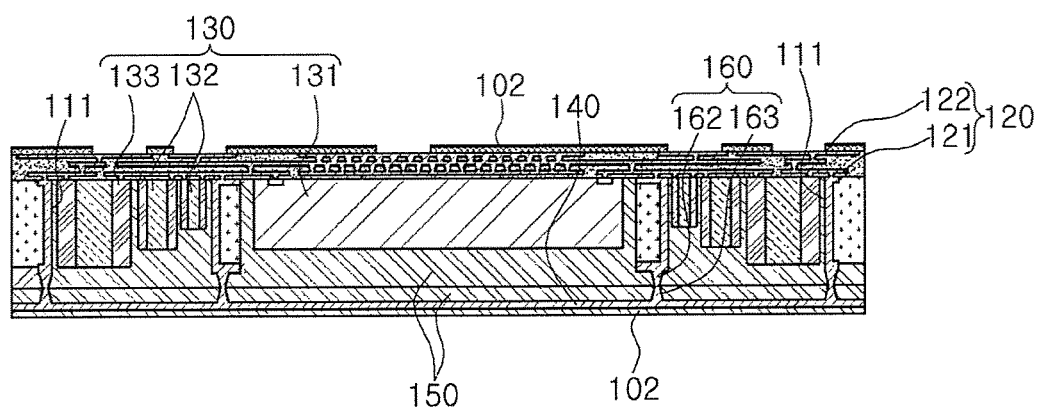

Then, as illustrated in FIG. 26, portions of the passivation layer 102 may be removed so that the electrical connection structures 170 (see FIG. 9) may be connected to portions of the wiring layer 122.

As described above, the wall 160 may be formed by the patterning to be disposed on the core member 110 and the metal plate 140, and a process of forming the wall 160 may thus be added or removed, if necessary.

Further, a shape and a disposition of the wall 160 may be easily changed.

Fan-out semiconductor packages according to other exemplary embodiments in the present disclosure will hereinafter be described with reference to the drawings.

However, a detailed description for the same components as the abovementioned components is omitted and is replaced by the abovementioned description.

Figure 27:
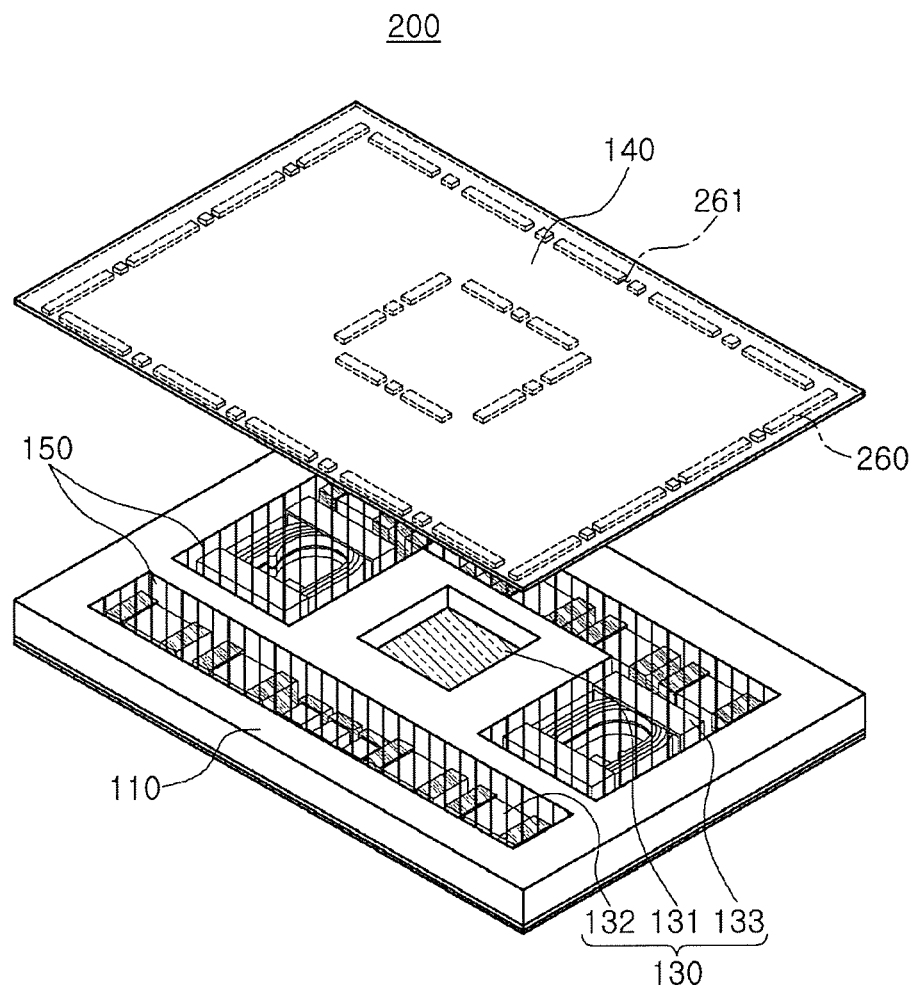
FIG. 27 is an exploded perspective view illustrating a fan-out semiconductor package according to a second exemplary embodiment in the present disclosure.

FIG. 27 is an exploded perspective view illustrating a fan-out semiconductor package according to a second exemplary embodiment in the present disclosure.

Referring to FIG. 27, a fan-out semiconductor package 200 according to a second exemplary embodiment in the present disclosure may include a core member 110, a redistribution portion (refer to the red redistribution portion 120 in FIG. 9), an electronic component 130, a metal plate 140, an encapsulant 150, and a wall 260 as an example.

Meanwhile, since the core member 110, the redistribution portion, the electronic component 130, the metal plate 140, and the encapsulant 150 correspond to the components described above, a detailed description therefor is omitted and is replaced by the abovementioned description.

The wall 260 may extend from a lower surface of the metal plate 140. Meanwhile, openings 261 providing a flow path of air may be formed in the wall 260 at the time of manufacturing the wall 260. A structure corresponding to the second wall 163 extending from an upper surface of the core member 110 may be omitted. As described above, the wall 260 may be disposed between the semiconductor chips 131 and the passive component 132, and interference between the semiconductor chips 131 and the passive component 132 due to EMI noise generated from the semiconductor chips 131 and the passive component 132 may thus be decreased.

As described above, leakage of the EMI noise may be decreased through the wall 260 and the metal plate 140.

In addition, since the fan-out semiconductor package 200 according to the second exemplary embodiment includes the wall 260 and the metal plate 140, a shield can may be omitted, and the fan-out semiconductor package 200 according to the second exemplary embodiment may thus be implemented to have a compact size and a small thickness.

Figure 28:
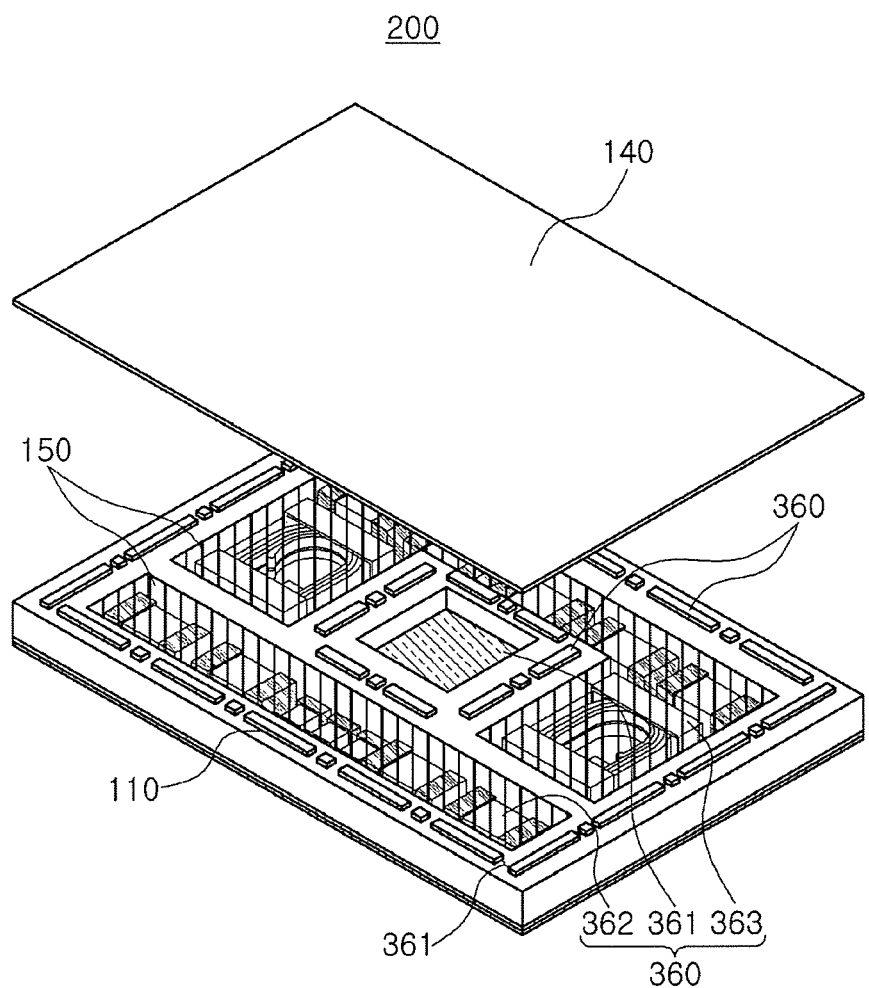
FIG. 28 is an exploded perspective view illustrating a fan-out semiconductor package according to a third exemplary embodiment in the present disclosure.

FIG. 28 is an exploded perspective view illustrating a fan-out semiconductor package according to a third exemplary embodiment in the present disclosure.

Referring to FIG. 28, a fan-out semiconductor package 300 according to a third exemplary embodiment in the present disclosure may include a core member 110, a redistribution portion (refer to the redistribution portion 120 in FIG. 9), an electronic component 130, a metal plate 140, an encapsulant 150, and a wall 360 as an example.

Meanwhile, since the core member 110, the redistribution portion, the electronic component 130, the metal plate 140, and the encapsulant 150 correspond to the components described above, a detailed description therefor is omitted and is replaced by the abovementioned description.

The wall 360 may extend from an upper surface of the core member 110, that is, a metal layer 115. Meanwhile, openings 361 providing a flow path of air may be formed in the wall 360 at the time of manufacturing the wall 360. A structure corresponding to the first wall 162 extending from a lower surface of the metal plate 140 may be omitted. As described above, the wall 360 may be disposed between the semiconductor chips 131 and the passive component 132, and interference between the semiconductor chips 131 and the passive component 132 due to EMI noise generated from the semiconductor chips 131 and the passive component 132 may thus be decreased.

As described above, leakage of the EMI noise may be decreased through the wall 360 and the metal plate 140.

In addition, since the fan-out semiconductor package 300 according to the third exemplary embodiment includes the wall 360 and the metal plate 140, a shield can may be omitted, and the fan-out semiconductor package 300 according to the third exemplary embodiment may thus be implemented to have a compact size and a small thickness.

Hereinafter, modified examples of a wall for shielding EMI will be described with reference to the drawings.

Figure 29:
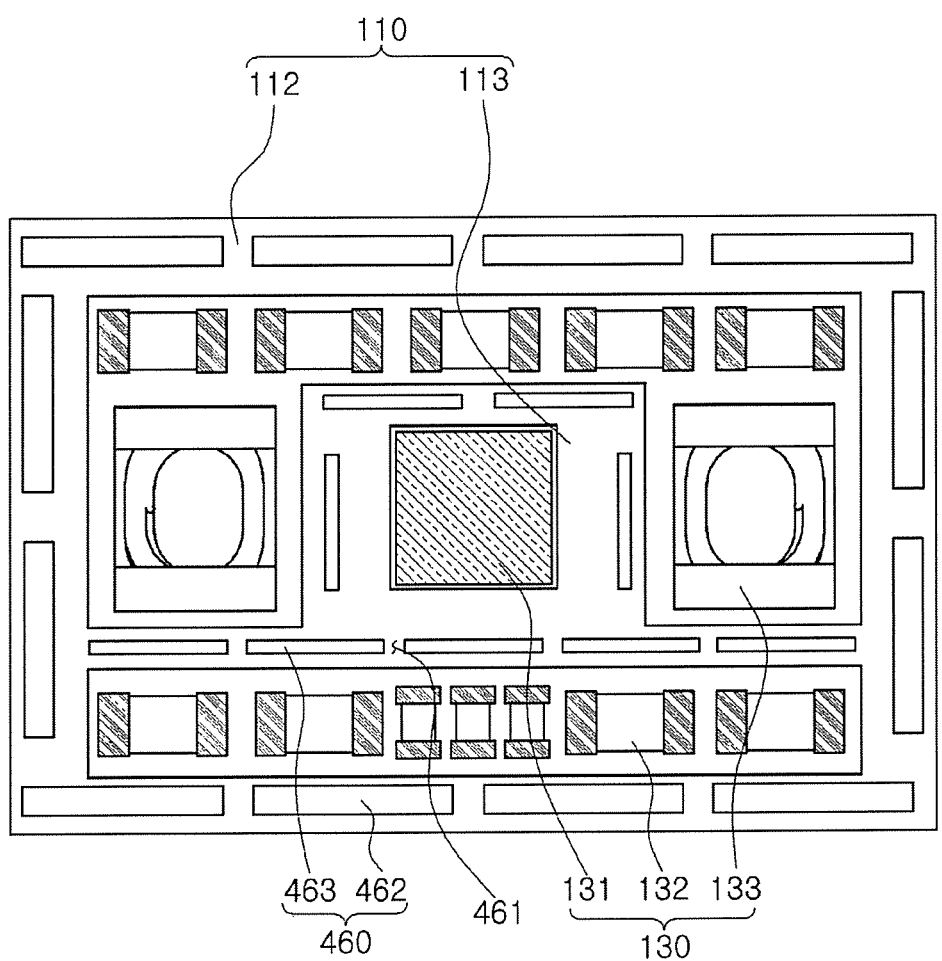
FIG. 29 is a view illustrating a first modified example of a wall.

FIG. 29 is a view illustrating a first modified example of a wall.

Referring to FIG. 29, a wall 460 may include a first wall 462 disposed on the outer wall portion 112 of the core member 110 and an edge of the metal plate 140 and a second wall 463 disposed on the inner wall portion 113 of the core member 110 and at an inner side of the metal plate 140.

Meanwhile, the first wall 462 may have a width greater than that of the second wall 463.

In addition, openings 461 may be formed in the first and second walls 462 and 463. That is, a plurality of first and second walls 462 and 463 may be disposed to be spaced apart from each other. In addition, the plurality of first walls 462 may have substantially the same length and the plurality of second walls 463 may have substantially the same length.

Figure 30:
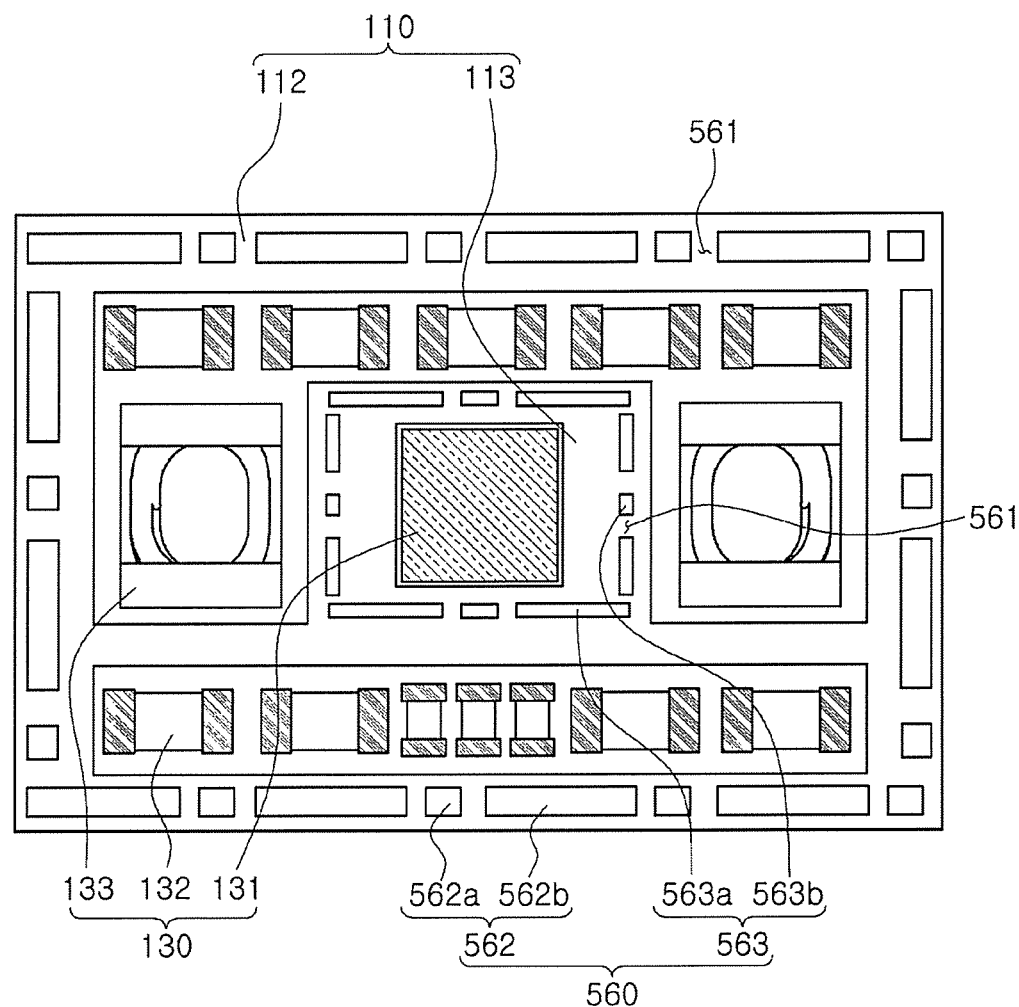
FIG. 30 is a view illustrating a second modified example of a wall.

FIG. 30 is a view illustrating a second modified example of a wall.

Referring to FIG. 30, a wall 560 may include a first wall 562 disposed on the outer wall portion 112 of the core member 110 and an edge of the metal plate 140 and a second wall 563 disposed on the inner wall portion 113 of the core member 110 and at an inner side of the metal plate 140.

Meanwhile, the first wall 562 may be have a width greater than that of the second wall 563.

In addition, openings 561 may be formed in the first and second walls 562 and 563. That is, a plurality of first and second walls 562 and 563 may be disposed to be spaced apart from each other. In addition, the plurality of first walls 562 may have different lengths, and the plurality of second walls 563 may have different lengths. That is, the first walls 562 may include 1-1-th walls 562a having a relatively greater length and 1-2-th walls 562b having a relatively smaller length, and the second walls 563 may also include 2-1-th walls 563a having a relatively greater length and 2-2-th walls 563b having a relatively smaller length.

Figure 31:
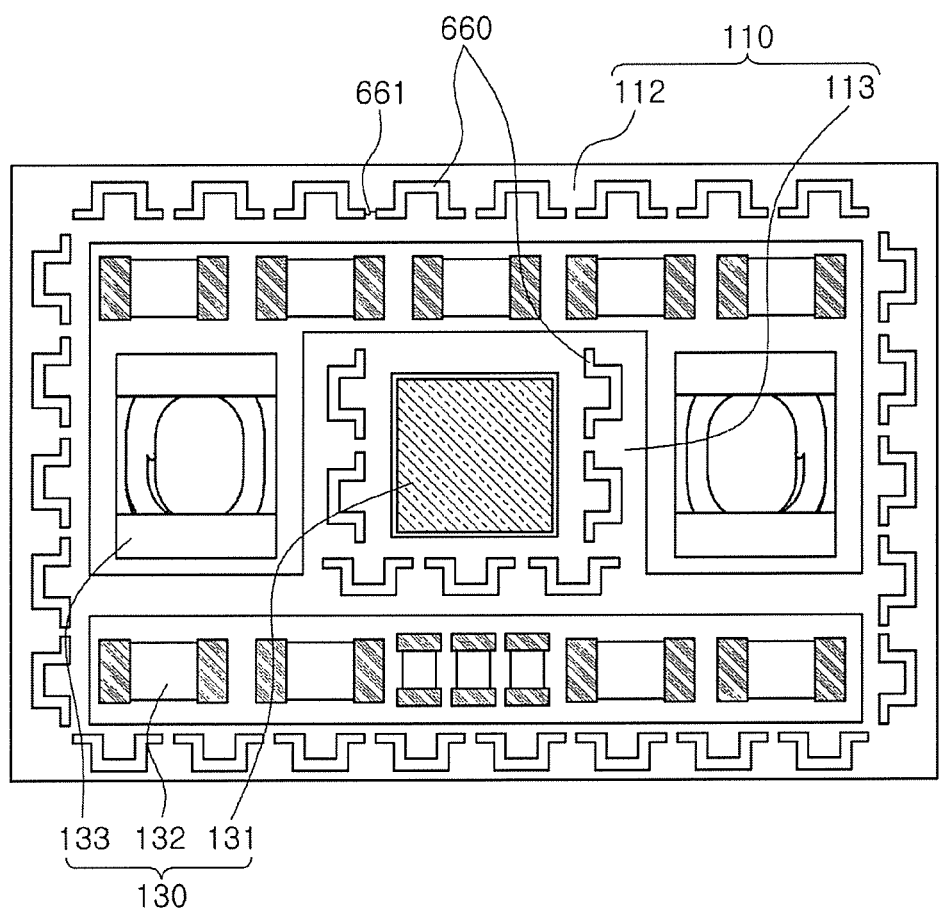
FIG. 31 is a view illustrating a third modified example of a wall.

FIG. 31 is a view illustrating a third modified example of a wall.

Referring to FIG. 31, a plurality of walls 660 may have a ruggedness shape (or a zigzag shape), and may be disposed to be spaced apart from each other. That is, openings 661 may be formed in the walls 660. In addition, the walls 660 may be disposed on the outer wall portion 112 and the inner wall portion 113 of the core member 110.

Figure 32:
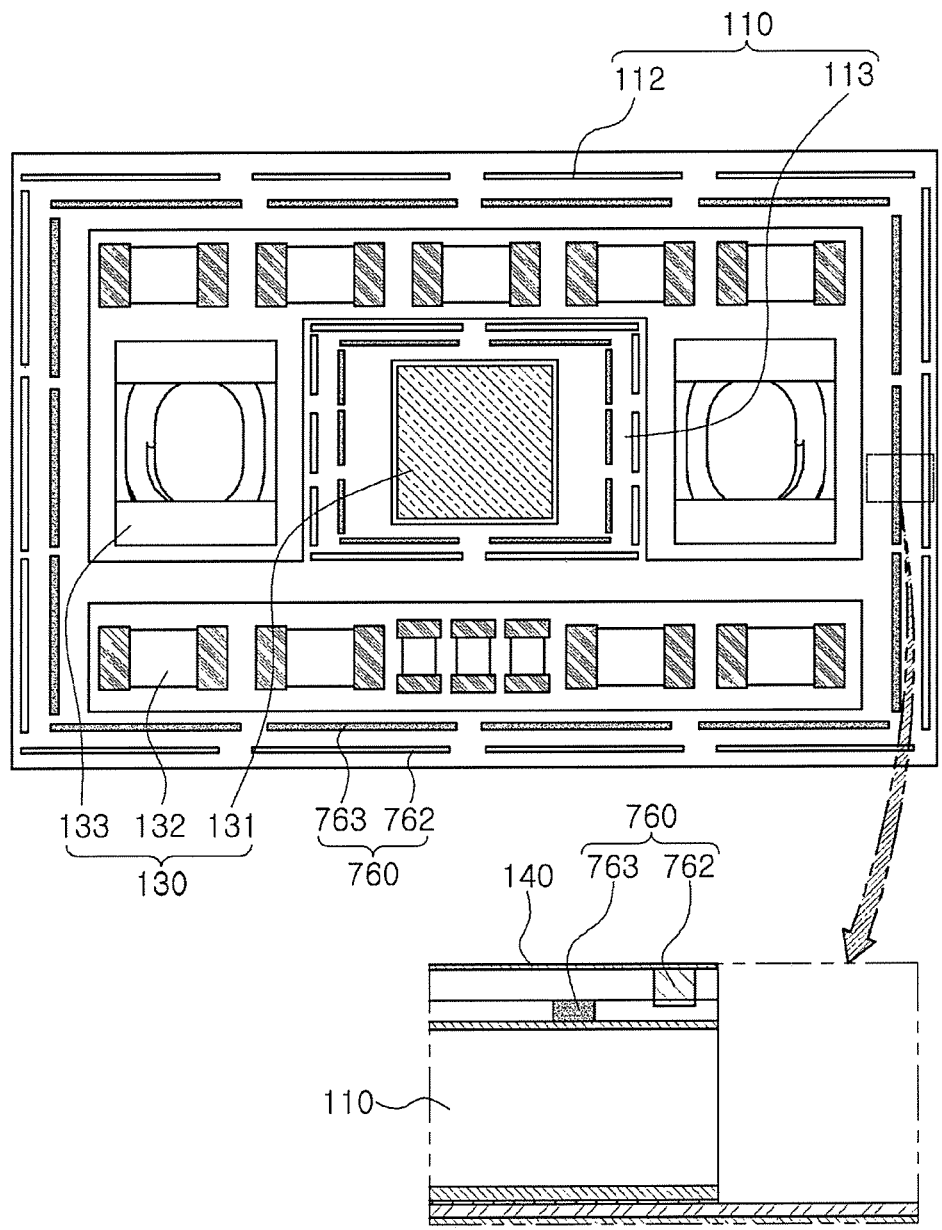
FIG. 32 is a view illustrating a fourth modified example of a wall.

FIG. 32 is a view illustrating a fourth modified example of a wall.

Referring to FIG. 32, a wall 760 may include a first wall 762 extending from a lower surface of the metal plate 140 and a second wall 763 extending from the metal layer of the core member 110.

Meanwhile, the first and second walls 762 and 763 may be disposed to be offset from each other.

In addition, openings 761 may be formed in the first and second walls 762 and 763.

As set forth above, EMI noise shielding efficiency may be improved, and the fan-out semiconductor package may be easily manufactured.

While exemplary embodiments have been shown and described above, it will be apparent to those skilled in the art that modifications and variations could be made without departing from the scope of the present invention as defined by the appended claims.

What is claimed is:

1. A fan-out semiconductor package comprising:
    a core member having at least one through-hole formed therein and having a metal layer disposed on at least a portion of an upper surface thereof;
    an electronic component disposed in the through-hole;
    an encapsulant encapsulating the core member and the electronic component;
    a metal plate disposed on an upper surface of the encapsulant; and a wall penetrating the encapsulant to connect the metal layer and the metal plate to each other, wherein the wall including sections spaced apart from each other.

2. The fan-out semiconductor package of claim 1, wherein the wall is made of a metal.

3. The fan-out semiconductor package of claim 1, wherein the metal layer is disposed on at least a portion of the core member, and the wall extends from the metal layer disposed on the upper surface of the core member.

4. The fan-out semiconductor package of claim 1, wherein the wall extends from a lower surface of the metal plate, and is connected to the metal layer disposed on the upper surface of the core member.

5. The fan-out semiconductor package of claim 1, wherein the wall includes a first wall extending from a lower surface of the metal plate and a second wall extending from an upper surface of the metal layer of the core member.

6. The fan-out semiconductor package of claim 5, wherein the first wall and the second wall are bonded to each other.

7. The fan-out semiconductor package of claim 1, wherein the wall has a zigzag shape.

8. The fan-out semiconductor package of claim 1, wherein the core member includes an insulator layer made of an insulating material and the metal layer disposed on an internal surface of the insulator layer and portions of an upper surface and a lower surface of the insulator layer.

9. The fan-out semiconductor package of claim 1, wherein the core member includes an outer wall portion disposed at an edge of the fan-out semiconductor package and an inner wall portion disposed inside the outer wall portion.

10. The fan-out semiconductor package of claim 9, wherein the wall disposed on the outer wall portion has a width greater than that of the wall disposed on the inner wall portion.

11. The fan-out semiconductor package of claim 1, wherein the electronic component includes a semiconductor chip disposed in the through-hole and a passive component spaced apart from the semiconductor chip.

12. A fan-out semiconductor package comprising:

a core member having at least one through-hole formed therein and having a metal layer disposed on at least a portion of an upper surface thereof;

an electronic component disposed in the through-hole;

an encapsulant encapsulating the core member and the electronic component;

a metal plate disposed on an upper surface of the encapsulant;

a first wall extending from the metal layer disposed on the upper surface of the core member; and a second wall extending from a lower surface of the metal plate, wherein the first wall and the second wall are offset from each other.

13. The fan-out semiconductor package of claim 12, wherein at least one of first and second walls includes sections spaced apart from each other.

* * * * *